United States Patent [19]

Sands

[11] Patent Number: 5,016,074
[45] Date of Patent: May 14, 1991

[54] EPITAXIAL INTERMETALLIC CONTACT FOR COMPOUND SEMICONDUCTORS

[75] Inventor: Timothy D. Sands, Cranbury, N.J.

[73] Assignee: Bell Communications Research, Inc., Livingston, N.J.

[21] Appl. No.: 537,685

[22] Filed: Jun. 14, 1990

Related U.S. Application Data

[60] Division of Ser. No. 267,073, Nov. 4, 1988, which is a continuation-in-part of Ser. No. 110,332, Oct. 20, 1987, abandoned.

[51] Int. Cl.⁵ ............... H01L 29/72; H01L 29/161; H01L 27/12
[52] U.S. Cl. ......................................... 357/34; 357/4; 357/15; 357/16; 357/55
[58] Field of Search ............ 357/4, 34, 15, 16, 22 D, 357/22 E, 22 G, 55, 22 J, 22 K

[56] References Cited

U.S. PATENT DOCUMENTS

| | | | |
|---|---|---|---|
| 4,378,629 | 4/1983 | Bozler et al. | 357/41 |
| 4,488,038 | 12/1984 | Harrison et al. | 357/15 |
| 4,495,511 | 1/1985 | Yoder | 357/15 |
| 4,529,997 | 7/1985 | Jay et al. | 357/68 |
| 4,724,220 | 2/1988 | Calviello | 357/15 |
| 4,752,812 | 6/1988 | Arienzo et al. | 357/4 |
| 4,758,534 | 7/1988 | Derkits, Jr. et al. | 357/56 |
| 4,785,340 | 11/1988 | Nakagawa | 357/16 |
| 4,901,121 | 2/1990 | Gibson et al. | 357/4 |
| 4,903,090 | 2/1990 | Yokoyama | 357/16 |

Primary Examiner—Andrew J. James
Assistant Examiner—Ngan Van Ngo
Attorney, Agent, or Firm—James W. Falk; Edward M. Fink

[57] ABSTRACT

A class of intermetallic compound contact materials for III-V semiconductors is obtained by depositing successively and concurrently a thin film of a transition metal and a Group III metal upon the semiconductor and annealing the resultant structure, so resulting in the formation of a monocrystalline intermetallic contact. The contacts are stable at temperatures ranging from 600°–900° C. and may be fabricated by conventional vacuum deposition.

1 Claim, 2 Drawing Sheets

EPITAXIAL INTERMETALLIC CONTACT FOR COMPOUND SEMICONDUCTORS

This is a division of application Ser. No. 07/267,073, filed No. 4, 1988, which is a continuation-in-part of Ser. No. 07/110,332, filed Oct. 20, 1987 now abandoned.

BACKGROUND OF THE INVENTION

This invention relates to metallic contacts for compound semiconductors. More particularly, the present invention relates to stable, single-phase, epitaxial metallic contacts for III-V compound semiconductors.

During the past two decades, considerable effort has been spent upon the development of metallic contacts for compound semiconductors. In general, workers in the art have focused upon three goals, namely, contact reproducibility and stability. Ideally, a contact that satifies these criteria should consist of only a single phase that is epitaxial on the III-V compound semiconductor substrate, thereby eliminating the interphase boundaries and grain boundaries that are commonly associated with contact degradation and the lack of reproducibility. Furthermore, the contact material should not react with the compound semiconductor at elevated temperatures since reaction would lead to the formation of a new phase and, thus, interphase boundaries. Any reaction is also undesirable since the reaction will result in the consumption of compound semiconductor material, leading to an uncertainty in the final position of the contact/semiconductor interface and thus, contact non-reproducibility. An additional requirement is that of monphological stability; that is, the contact material should have a sufficiently high bond strength and melting point so that the contact film does not ball up agglomerate during required thermal processing steps subsequent to contact deposition. For example, the contact must not agglomerate during the implant activation step (typically 800° C. for several minutes or 950° C. for several seconds) required when the contact is used as an implant mask. Likewise the contact must remain laterally uniform for hours at 500°-700° C. during the growth of a III-V semiconductor overlayer.

Unfortunately, none of the prior art efforts has succeeded in fabricating a contact that is single-phase, epitaxial, and stable against both film agglomeration and reactions with the III-V semiconductor substrate. Thus, for example, nominally monocrystalline films of aluminum have been grown on gallium arsenide by molecular beam epitaxy under ultra-high-vacuum conditions. However, the melting point of aluminum (660° C.) is made too low to withstand thermal processing at elevated temperatures. Furthermore, exposure of aluminum to arsenic results in the formation of aluminum arsenide, thus preventing the overgrowth of III-V semiconductors such as gallium arsenide on films of aluminum without the transformation of the metallic aluminum to semiconducting or insulating aluminum arsenide.

Still further efforts to effect the desired end involved the deposition of transition metals such as nickel, cobalt and iron upon gallium arsenide under ultra-high vacuum conditions. Although such techniques resulted in the formation of films evidencing a high degree of crystallographic texture, none of these metals proved stable on gallium arsenide since moderate annealing at temperatures above 400° C. is sufficient to produce ternary and binary product phases. In related work it has been demonstrated that reacting thin films of nickel or cobalt with gallium arsenide does produce stable binary phases that are epitaxial. However, undesirable, nonepitaxial nickel-arsenide and cobalt-arsenide phases are formed as well. The fact that these reactions consume the III-V substrate is undesirable from a contact reproducibility perspective. Furthermore, these two-phase films agglomerate at elevated temperatures, leading to laterally nonuniform contacts with poor electrical properties. In addition, the partially non-epitaxial nature of the two-phase films makes these contacts unsuitable as templates for compound semiconductor overgrowth.

SUMMARY

In accordance with the present invention, these prior art limitations are effectively obviated by the use of a class of intermetallic contact materials to III-V compound semiconductors which are stable at temperatures ranging from 500°-900° C., epitaxial and single-phase in nature, and resistant to agglomeration at the elevated temperatures necessary for overgrowth of III-V compound semiconductors. The described intermetallic compounds comprise approximately 50 atomic percent of the Group III element, aluminum, so minimizing the enthalpic driving force for reaction with the III-V substrate. The remaining 50 atomic percent comprises a transition metal such as, but not limited to, an element selected from among cobalt, nickel, rhenium, iron, rhodium, manganese, iridium, osmium and ruthenium, such that the transition metal with the aluminum forms an intermetallic phase with the crystallographic structure known as the cesium chloride structure. These intermetallic aluminides in accordance with my invention provide contact materials for III-V semiconductors that are epitaxial and single-phase in nature. These intermetallic aluminide contacts are also stable in that no new product phases are formed during annealing at elevated temperatures. The high melting points of these intermetallic aluminides (typically several hundred °C. higher than the melting points of transition metal-gallium phases with the same structure, for example, 1638° C. for nickel-aluminum and 1220° C. for nickel-gallium) ensure that even very thin contact layers will resist agglomeration during exposure to the elevated temperatures needed for overgrowth of epitaxial III-V semiconductor layers. In addition, since the aluminum and the transition metal are deposited together, either simultaneously or in alternating layers, there is essentially no consumption of the III-V compound semiconductor substrate, thus maintaining optimum control of contact morphology and, thus, reproducibility of contact properties. Furthermore, the single-phase, single-crystal nature of these contacts eliminates contact degradation mechanism that involve grain boundary diffusion, a major source of instability. Accordingly, these intermetallic aluminides are ideally suited for rectifying gate contacts to field effect transistors, particularly those field-effect transistors that require annealing treatments subsequent to deposition of the gate contact such as the transistors fabricated by the self-aligned processing technique that undergo an implant activation anneal at an elevated temperature (typically −800° C. for several minutes).

Still further, the intermetallic contacts of this invention permit the fabrication of buried electronic and photonic devices based upon compound semiconductor/metal/compound semiconductor heterojunctions, for example, metal base and permeable base transistors. It should be noted that epitaxial III-V semiconductor/metal/III-V semiconductor heterostructures had not been fabricated prior to this invention. In the case of the metal-base transistor which continuous and epitaxial metallic base layers, the prior inability to grow epitaxial III-V semiconductor/metal/III-V semiconductor heterostructures prevented the fabrication of these devices. The invention of a stable and epitaxial metal contact as described herein permits the realization of such device structures for the first time. In the case of the permeable-base transistor, prior art as described in U.S. Pat. No. 4,758,534 describes the fabrication of such devices with polycrystalline (nonepitaxial) metal base layers, the seeding of the upper epitaxial layer of III-V semiconductor material occurring in regions of the underlying semiconductor that are exposed by pinholes, perforations or lithographically defined patterns in the metal base. The invention of a stable and epitaxial contact as described here allows the seeding of the III-V semiconductor overlayer to occur on the metal base as well as in exposed regions, thereby eliminating problems associated with the undesirable seeding of III-V semiconductor material on a polycrystalline base.

BRIEF DESCRIPTION OF THE DRAWINGS

The invention will be more readily understood by reference to the following detailed description taken in conjunction with the accompanying drawing wherein.

DESCRIPTION OF THE PREFERRED EMBODIMENT

In the fabrication of the described contacts, a suitable substrate is first selected and prepared for deposition of the intermetallic contact. Substrates suitable for this purpose may be selected from among the commercially available Group III-V materials, for example, indium gallium arsenide, gallium arsenide, aluminum gallium arsenide, indium phosphide and the like.

The substrate selected is initially cleansed by conventional cleansing techniques for the purpose of removing deleterious organics from the surface thereof and forming thereon a thin film, typically 10–20 Angstroms in thickness, of a native oxide. Next, a transition metal is deposited upon the substrate selectively by vacuum evaporation or electron beam techniques, the metal selected being such that its lattice parameters are sufficient to yield a monocrystalline film with the Group III metals employed herein. Transition metals meeting this requirement include cobalt, nickel, iron, manganese, iridium, osmium, rhodium, and ruthenium. However, it will be understood that stable epitaxial contacts for group III-V compound semiconductors must be matched to provide compatible lattice parameters and electrical characteristics, such being known to those skilled in the art.

Deposition of the transition metal on the substrate surface is effected to yield a thickness ranging from 50–200 Amgstroms, the film so deposited serving to mechanically disperse the native oxide on the substrate.

Following, a Group III metal in elemental form is deposited upon the transition metal in a thickness ranging from 100–800 Angstroms such that the atomic ratio between the two deposited metals is approximately 1:1, deposition being effected as described above. Then, a second film of the transition metal may optionally be deposited, as previously described to provide protection to the aluminum surface of the contact, thereby avoiding oxidation during handling outside the vacuum system.

At this juncture, the structure so prepared is subjected to thermal annealing at a temperature ranging from 350°–950° C. for a time period ranging from a few seconds to several minutes, the anneal resulting in the formation of a monocrystalline or epitaxial intermetallic contact which is now amenable for fabrication of any device requiring a Schottky barrier. Specifically in accordance with aspects of my invention devices incorporating this intermetallic contact may include field effect transistors, metal base transistors including two layers of a compound semiconductor separated by a thin film of my intermetallic compound, permeable base transistors comprising a semiconductor sandwich having a patterned intermediate layer comprising a thin film of the intermetallic compound, and buried interconnects including the intermetallic compound in accordance with my invention.

Figure 1:
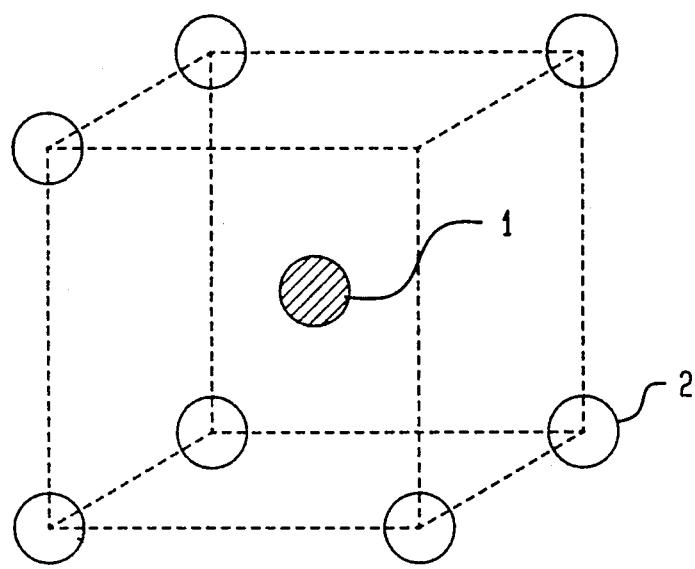
FIG. 1 is a pespective view of the cesium chloride structure of the transition metal aluminum contacts of the invention.

With reference now to FIG. 1, there is shown, in perspective, a cesium chloride crystalographic structure adopted on the transition metal aluminide contacts of the invention. Shown in a single unit cell which, in the crystalline contact material, is reproduced periodically in three orthogonal directions. In the figure, atom 1 at the unit cell center is aluminum. Atom 2 at the corner of the cell is the transition metal which may be interchanged with atom 1 to yield an equivalent three dimensional structure.

Figure 2:
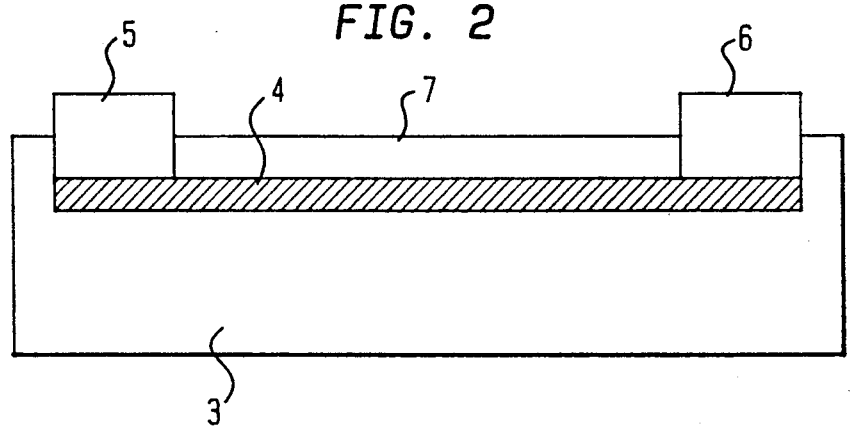
FIG. 2 is a front elevational view in cross-section of a buried interconnect providing direct electrical connection between two laterally separated portions of a III-V compound semiconductor wafer.

FIG. 2 is a broken cross-sectional view of a buried interconnect of the invention which provides direct electrical connection between two laterally separated portions of a III-V wafer 3. The epitaxial transition metal aluminide film 4 connects a first device or circuit 5 to a second device or circuit 6. Also shown is epitaxial III-V semiconductor layer 7 grown upon the transition metal aluminide film 4. Thus, the buried interconnect does not occupy any space on the wafer surface. It will also be appreciated that another layer of epitaxial transition metal aluminide interconnects and the repetition of the growth sequence, essentially ad infinitum, permits the three dimensional integration (vertically and laterally) of III-V semiconductor devices.

Figure 3:
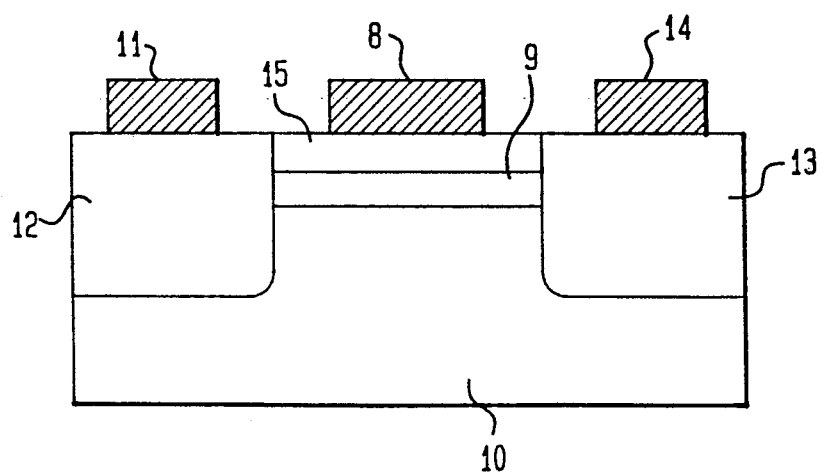
FIG. 3 is a front elevational view in cross-section of a field effect transistor including an epitaxial transition metal aluminide of the invention as a gate contact.

In FIG. 3, there is shown a cross sectional view of a field effect transistor employing the epitaxial transition metal aluminide of the invention as the gate contact. Shown are compound semiconductor substrate 10, semiconductor wells 12 and 13, source ohmic contact 11, drain ohmic contact 14 and gate contact 8. Also shown is a conducting channel 9 formed on substrate 10 prior to gate contact 8 deposition. Channel 9 may be separated from gate electrode 8 by a III-V compound semiconductor spacer or barrier layer 15. In the operation of this device, a voltage is applied to gate contact 8 which modulates the flow of current in conducting channel 9, current flowing from source ohmic contact 11 through well 12 and channel 9 to well 13 and finally to drain ohmic contact 16.

Figure 4:
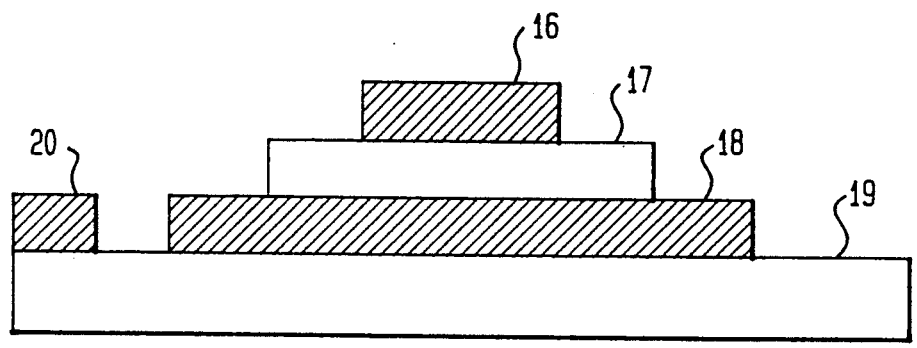
FIG. 4 is a front elevational view in cross-section of a metal base transistor including an epitaxial layer of a transition metal aluminide of the invention as a base of the transistor.

FIG. 4 is a cross-sectional view of a metal base transistor employing an epitaxial layer of a transition metal aluminide of the invention as the base of the transistor. Shown in the figure are compound semiconductor collector 11 having deposited thereon epitaxial transition metal-aluminide base 18, collector contact 20, compound semiconductor emitter 17 and emitter contact 16. In the operation of the device, current flows from emitter contact 16 through compound semiconductor emitter 17 and through base 18 and compound semiconductor collector 19. Finally, current travels through collector contact 20. A voltage applied to the transition metal-aluminide base modulates the flow of this current from emitter to collector. The metal base transistor is distinct from the permeable base transistor in that current flows primarily through the metal base in the former whereas current flows primarily through semiconductor channels in the latter.

Figure 5:
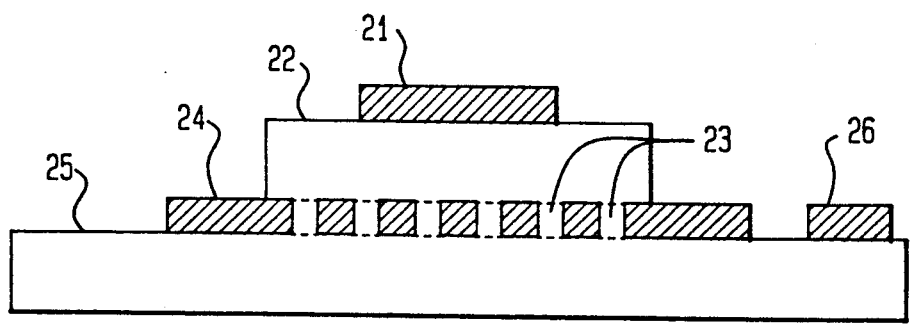
FIG. 5 is a front elevational view in cross-section of a permeable base transistor including a patterned epitaxial layer of a transition metal aluminide of the invention as the base of the transition.

Shown in FIG. 5 is a cross-sectional view of a permeable base transistor employing a patterned epitaxial layer of a transition metal aluminide of the invention as the base of the transistor. Shown are compound semiconductor collector 25, collector contact 26, emitter contact 21, compound semiconductor emitter 22 and epitaxial transition metal aluminide base 24 patterned so as to create channels 23. In the operation of the device 1, current flows from either contact 21 through compound semiconductor emitter 22 and through channels 23 in base 24. Following, current passes through compound semiconductor collector 25 and through collector contact 26. Application of a voltage to epitaxial base 24 creates an electric field in the semiconductor which modulates the flow of current through channels 23.

The following example is set forth for purposes of exposition. It will, however, be understood that the example is solely for purposes of exposition and is not to be construed as limiting.

EXAMPLE

A polished (100) gallium arsenide wafer was etched with a 5:1:1 mixture of sulfuric acid, hydrogen peroxide and water and then given a one minute dip in a 1:1 solution of hydrochloric acid and deionized water. The wafer was next blown dry with nitrogen.

Following, the wafer was loaded into an electron gun evaporation chamber which was then pumped down to $8 \times 10^{-7}$ torr. Thin alternate layers of nickel and aluminum were then deposited to yield a layering sequence comprising 10 nm nickel-34 nm aluminum-10 nm nickel - gallium arsenide. This film sequence was chosen based upon prior efforts which revealed that a thin nickel layer will penetrate the native oxide of gallium arsenide at moderate temperatures (room temperature to approximately 300° C., depending on oxide thickness). The layer thicknesses were chosen to given an average composition of approximately $Ni_{45}Al_{55}$. Studies have shown that the nickel-aluminum phase can accommodate compositions from $Ni_{45}Al_{55}$ to $Ni_{60}Al_{40}$.

Following deposition, the gallium arsenide wafer was capped with 200 nm of aluminum nitride deposited by reactive ion beam sputtering. This cap served to prevent the loss of arsenic from the gallium arsenide substrate during the subsequent high temperature annealing step. Annealing was then effected with an incoherent light rapid annealing station at a temperature of 850° C. for 10 seconds following which the aluminum nitride cap was removed by dipping in buffered hydrogen fluoride. The film so annealed was then characterized by transmission electron microscopy, electron diffraction and x-ray diffraction.

The electron diffraction studies revealed the presence of a well oriented layer of single crystal nickel aluminum. This wasd confirmed by the transmission electron microscopy and x-ray diffraction studies.

Forward I-V measurements were made with a Keithley model 220 programmable current source and a Keithley model 619 electrometer. These measurements are summarized in the Table which follows.

In the table, data is presented indicating the barrier heights and ideality factors of nickel aluminum contacts to n-gallium arsenide, the data being based upon the current-voltage studies. For comparative purposes, barrier heights and ideality factors of selected refractory contacts to n-gallium arsenide are shown. It is noted from the Table that the measured barrier height increases by 200 mV to 0.99 V when annealed at temperatures of up to 650° C. while retaining an ideality factor approaching unity (1.10), the characteristics sought in a stable Schottky contact. It will be appreciated that this is among the highest measured barrier heights reported in the literature for contacts to n-gallium arsenide. At annealing temperatures greater than 650° C. the data deviates from the ideal thermionic emission; however, the contacts remain rectifying.

| NiAl/n-GaAs | | | refractory contacts to n-GaAs | | | |
|---|---|---|---|---|---|---|
| annealing treatment | $\phi_b(V)$ | n | contact | annealing treatment | $\phi_b(V)$ | n |
| as deposited | 0.79 | 1.05 | W | 950° C., 10 min | 0.74 | 1.2 |
| 500° C., 20s | 0.76 | 1.11 | WSi$_{0.11}$ | 800° dC., 10 min | 0.73 | 1.14 |
| 600° C., 20s | 0.92 | 1.09 | WN | 600° C., 10s | 0.87 | 1.08 |
| 650° C., 20s | 0.99 | 1.10 | WN | 700° C., 10s | 0.91 | 1.09 |
| 700° C., 20s | 0.94$^a$ | 1.38 | WN | 800° C., 20s | 0.95 | 1.09 |
| 800° C., 20s | 0.95$^a$ | 1.40 | WN | 900° C., 10s | 0.90 | 1.15 |
| 950° C., 20s | 0.82$^a$ | 2.07 | ZrN | 850° C., 10s | 0.90 | 1.02 |

The metallurgically stable Schottky contact to n-gallium arsenide described, as noted, evidences a barrier height (0.99 v) comparable to or higher than barrier heights measured for nitrides annealed under similar conditions and significantly higher than barrier heights obtained with elemental refractory metals or silicides. Furthermore, the adherence and mechanical properties of the nickel-aluminum-nickel layer structure on gallium arsenide are compatible with conventional lift-off patterning techniques, so suggesting the use thereof in self aligned metal-semiconductor field effect transistors.

It will be appreciated by those skilled in the art that modification within the purview of the skilled artisan may be made without departing from the spirit and scope of the invention. Thus, for example, the intermetallic contact may be prepared by co-deposition of the metal components and various combinations of metallizations may be prepared so long as the intermetallic phase thus formed adopts the cesium chloride structure.

It will be further understood that the drscribed intermetallic contact may serve as a template for the growth of crystalline compound semiconductors. Epitaxial compound semiconductors/metal/compound semiconductor heterostructures were grown by molecular beam epitaxy to implement this aspect of the invention. 30 separate wafers with the basic layer sequence aluminum gallium arsenide/aluminum gallium arsenide were grown on gallium arsenide substrates. All layers were found to be epitaxial and the nickel aluminum layers were found to be electrically continuous, even for films as thin as 3 nm.

What is claimed is:

1. Epitaxial permeable-base transistor comprising:

(a) a single-crystal III-V semiconductor layer that serves as the collector of the transistor;

(b) a single-crystal III-V semiconductor layer that serves as the emitter of the transistor;

(c) an epitaxial layer of a transition metal aluminide that serves as the base of the transistor, said aluminide being of the cesium chloride structure and comprising aluminum and a transition metal in a 1:1 atomic ratio, said epitaxial layer being in the form of a patterned grid sandwiched between said III-V semiconductor collector and said III-V semiconductor emitter such that the current flow between emitter and collector passes through semiconductor materials in the perforation of the base or between base grid bars, said current being modulated by the electric field created by a voltage applied to the base, (d) ohmic contact to the collector, (c) ohmic contact to the base, and (d) ohmic contact to the emitter.

* * * * *